US010871838B2

(12) United States Patent
Teramoto

(10) Patent No.: US 10,871,838 B2
(45) Date of Patent: Dec. 22, 2020

(54) DISPLAY DEVICE

(71) Applicant: Japan Display Inc., Minato-ku (JP)

(72) Inventor: Masahiro Teramoto, Minato-ku (JP)

(73) Assignee: Japan Display Inc., Minato-ku (JP)

(*) Notice: Subject to any disclaimer, the term of this patent is extended or adjusted under 35 U.S.C. 154(b) by 143 days.

(21) Appl. No.: 16/026,502

(22) Filed: Jul. 3, 2018

(65) Prior Publication Data

US 2019/0033995 A1 Jan. 31, 2019

(30) Foreign Application Priority Data

Jul. 25, 2017 (JP) ................................ 2017-143676

(51) Int. Cl.
*G06F 3/041* (2006.01)
*G02F 1/1333* (2006.01)
*G06F 3/044* (2006.01)

(52) U.S. Cl.
CPC .......... *G06F 3/041* (2013.01); *G02F 1/13338* (2013.01); *G06F 3/044* (2013.01); *G06F 3/0412* (2013.01); *G02F 2201/56* (2013.01); *G06F 2203/04112* (2013.01)

(58) Field of Classification Search
CPC ........ G06F 3/041; G06F 3/0412; G06F 3/044; G06F 2203/04112; G02F 2201/56
See application file for complete search history.

(56) References Cited

U.S. PATENT DOCUMENTS

| 2011/0193820 | A1* | 8/2011 | Chen | G06F 3/044 345/174 |
| 2013/0328051 | A1* | 12/2013 | Franklin | H01L 29/786 257/59 |
| 2014/0320760 | A1 | 10/2014 | Ishizaki et al. | |
| 2014/0327842 | A1* | 11/2014 | Tang | G06F 3/044 349/12 |
| 2016/0011717 | A1 | 1/2016 | Ishizaki et al. | |
| 2017/0315664 | A1 | 11/2017 | Ishizaki et al. | |
| 2017/0351132 | A1* | 12/2017 | Kanari | G09G 3/3655 |
| 2018/0107079 | A1* | 4/2018 | Tae | G02F 1/134309 |

FOREIGN PATENT DOCUMENTS

JP 2014-191650 10/2014

* cited by examiner

*Primary Examiner* — Wing H Chow
(74) *Attorney, Agent, or Firm* — Oblon, McClelland, Maier & Neustadt, L.L.P.

(57) ABSTRACT

A display device includes a display panel having a display area where subpixels for emitting light in different colors are arranged in a matrix shape, the display panel having a peripheral area where terminals and a drive circuit are formed; and metal lines for touch sensing on the display panel. The display panel has a non-rectangular shape with a curve part of a contour in a plan view. The metal lines extend in at least two directions and cross at portions to form a mesh shape. The subpixels include some subpixels arranged step-wise in an outline area of the display area next to the curve part of the contour. None of the metal lines is formed on the subpixels arranged stepwise.

9 Claims, 7 Drawing Sheets

DISPLAY DEVICE

CROSS-REFERENCE TO RELATED APPLICATION

The present application claims priority from Japanese application JP2017-143676 filed on Jul. 25, 2017, the content of which is hereby incorporated by reference into this application.

BACKGROUND OF THE INVENTION

1. Field of the Invention

This relates to display devices.

2. Description of the Related Art

Liquid crystal display devices are typical flat displays and are used in various fields for display devices of office automation (OA) equipment such as personal computers and TV sets, taking advantage of features such as lightweight, thin thickness, and low power consumption. Recently, liquid crystal display devices have been used for display devices in portable terminals such as mobile phones, car navigation devices, and game consoles.

Modification to a display area of images has been required to respond to a non-rectangular shape such as a circle or an oval, in addition to a rectangle with right angles at four corners.

Most display devices specifically for mobile application include a touch sensing function, which may be in a capacitance type for touch sensing when built in the display device. The capacitance type includes a mutual capacitance type and a self-capacitance type. The mutual capacitance type may include transmission electrodes Tx and reception electrodes Rx, detecting electric field change between these electrodes to locate a touching position. These electrodes used to be transparent electrodes such as indium tin oxide (ITO) to diminish influence on display although a recent case shows that the reception electrodes Rx are made from metal to lower electrical resistance (JP 2014-191650 A).

The reception electrode Rx made from metal has lower electrical resistance but has opacity, requiring modification to diminish influence on display. Specifically, a display device in a non-rectangular shape with a curve part on its periphery may have opaque reception electrodes Rx on pixels in the curve part, affecting display thereof.

This is to aim at providing a display device with a touch sensing function in response to a display area in a non-rectangular shape.

SUMMARY OF THE INVENTION

A display device may include a display panel having a display area where subpixels for emitting light in different colors are arranged in a matrix shape, the display panel having a peripheral area where terminals and a drive circuit are formed; and metal lines for touch sensing on the display panel. The display panel has a non-rectangular shape with a curve part of a contour in a plan view. The metal lines extend in at least two directions and cross at portions to form a mesh shape. The subpixels include some subpixels arranged stepwise in an outline area of the display area next to the curve part of the contour. None of the metal lines is formed on the subpixels arranged stepwise.

The metal lines for touch sensing do not deteriorate display in an area whose contour is in a non-rectangular shape.

DETAILED DESCRIPTION OF THE INVENTION

Figure 1:
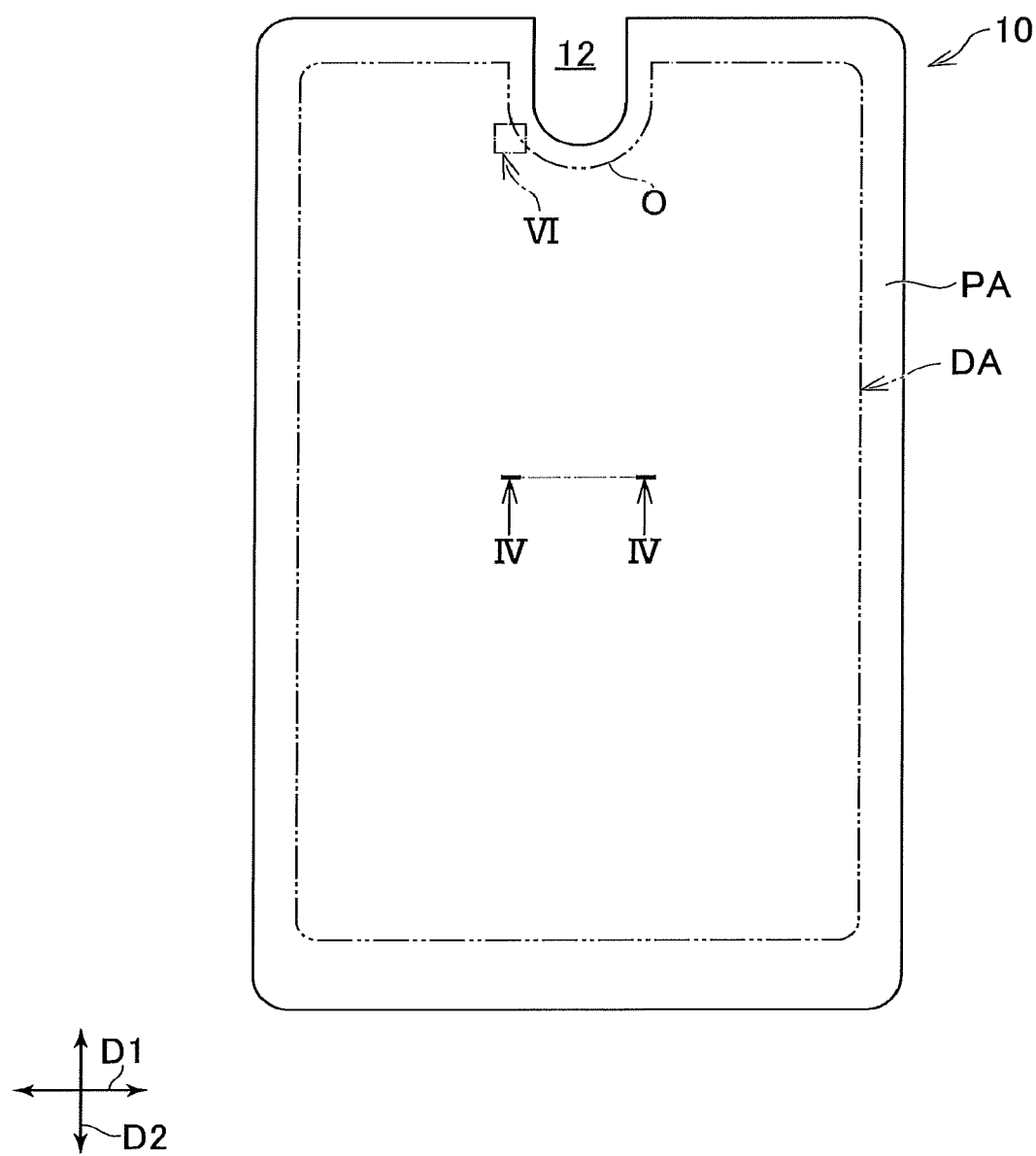
FIG. 1 is a schematic plan view of a display device in accordance with an embodiment.

Hereinafter, some embodiments will be described with reference to the drawings. Here, the invention can be embodied according to various aspects within the scope of the invention without departing from the gist of the invention and is not construed as being limited to the content described in the embodiments exemplified below.

The drawings are further schematically illustrated in widths, thickness, shapes, and the like of units than actual forms to further clarify description in some cases but are merely examples and do not limit interpretation of the invention. In the present specification and the drawings, the same reference numerals are given to elements having the same functions described in the previously described drawings and the repeated description will be omitted.

Further, in the detailed description, "on" or "under" in definition of positional relations of certain constituents and other constituents includes not only a case in which a constituent is located just on or just under a certain constituent but also a case in which another constituent is interposed between constituents unless otherwise mentioned.

FIG. 1 is a schematic plan view of a display device in accordance with an embodiment. The display device of the embodiment has a display panel in a non-rectangular shape whose contour has a curve portion in a plan view. Specifically, a corner is rounded, and a cutout is formed in a portion. The display panel 10 has a cutout 12. The cutout 12 is formed in the middle of an end part of the display panel 10 along a first direction D1 (lateral direction in FIG. 1) on an upper side. The display panel 10 has a display area DA for displaying images. The display panel 10 has a peripheral area PA, outside (around) the display area DA, where a drive circuit and terminals for receiving signals from outside are formed.

The cutout 12 has a U-shape. Correspondingly, the display area DA has an outline O with a portion along the contour of the display panel 10.

Figure 2:
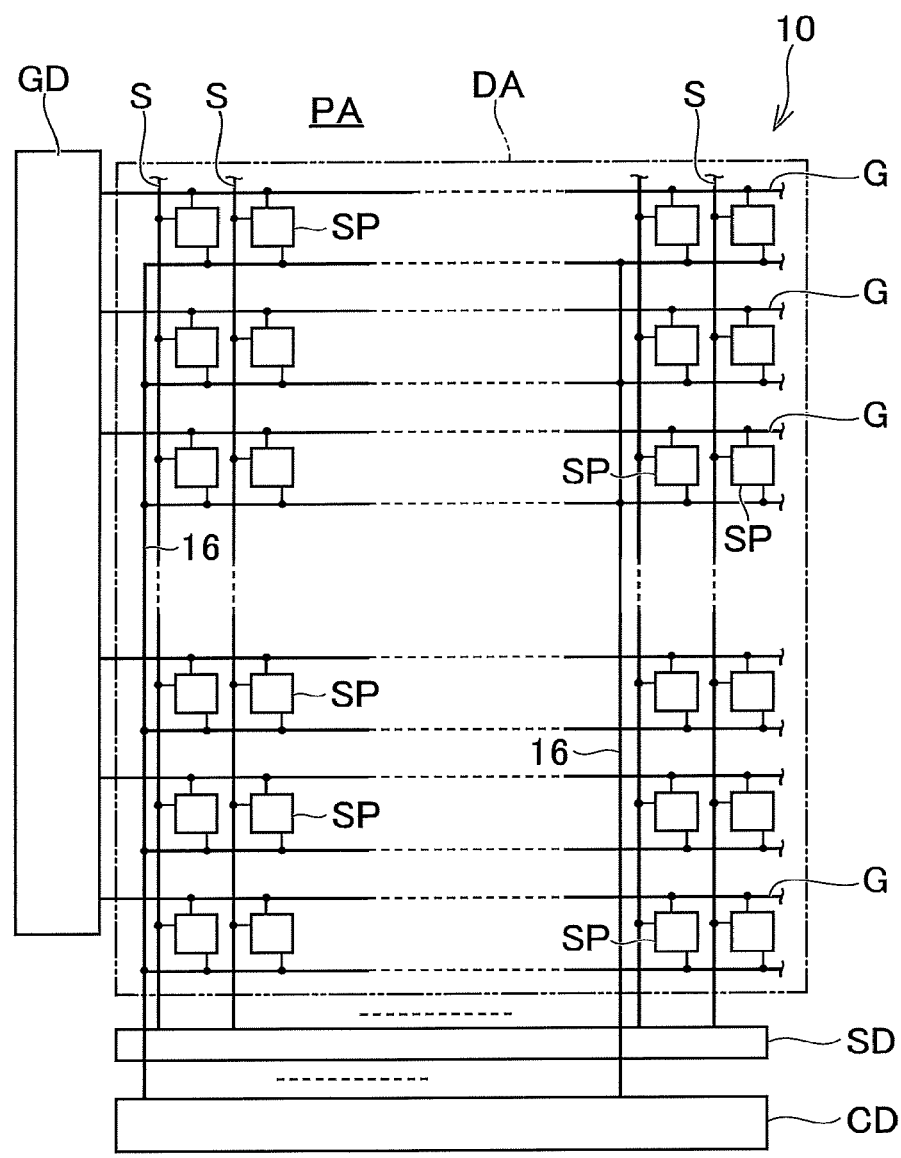
FIG. 2 is a circuit diagram of the display device in FIG. 1.
Figure 2:
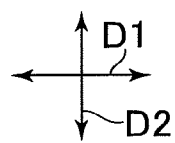
Figure 3:
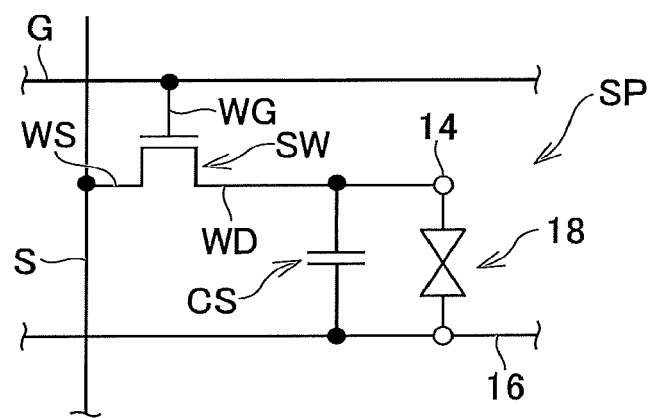
FIG. 3 is a detail view of a portion of the circuit in FIG. 2.

FIG. 2 is a circuit diagram of the display device in FIG. 1. FIG. 3 is a circuit configuration of a subpixel SP in FIG. 2. The display panel 10 is equipped with a plurality of subpixels SP in the display area DA. Each subpixel SP is herewith a minimum pixel area per unit to be individually controlled in accordance with a video signal. Each subpixel SP may be disposed in a region including a switching element SW at a position where a scan line G and a signal line S cross each other. The plurality of subpixels SP are arranged in a matrix shape in a first direction D1 and a second direction D2. The scan lines G extend in the first direction D1 and are arranged in the second direction D2. The signal lines S extend in the second direction D2 and are arranged in the first direction D1. The scan lines G and the signal lines S need not to extend straight but may be partially bent. The scan lines G and the signal lines S extend to the peripheral area PA outside the display area DA. In the first peripheral area PA, the scan lines G are connected to a scan drive circuit GD and the signal lines S are connected to a signal drive circuit SD.

Each subpixel SP has a pixel electrode 14 and a common electrode 16. The pixel electrode 14 is opposed to the common electrode 16 to drive a liquid crystal layer 18 by an electrical field generated between the pixel electrode 14 and the common electrode 16. A storage capacitor CS may be formed between the common electrode 16 and the pixel electrode 14. The common electrodes 16, which will be described later, spread over the plurality of subpixels SP. The common electrodes 16 are connected to a common electrode drive circuit CD in the peripheral area PA.

The subpixel SP is equipped with a switching element SW. The switching element SW may consist of a thin film transistor (TFT) and is electrically connected to the scan line G and the signal line S. Specifically, the switching element SW is equipped with a gate electrode WG, a source electrode WS, and a drain electrode WD. The gate electrode WG is electrically connected to the scan line G. One illustrated electrode electrically connected to the signal line S is referred to as the source electrode WS; another illustrated electrode electrically connected to the pixel electrode 14 is referred to as the drain electrode WD. Each scan line G is connected to some switching elements SW in some subpixels SP arranged in the first direction D1. Each signal line S is connected to some switching elements SW in some subpixels SP arranged in the second direction D2.

Figure 4:
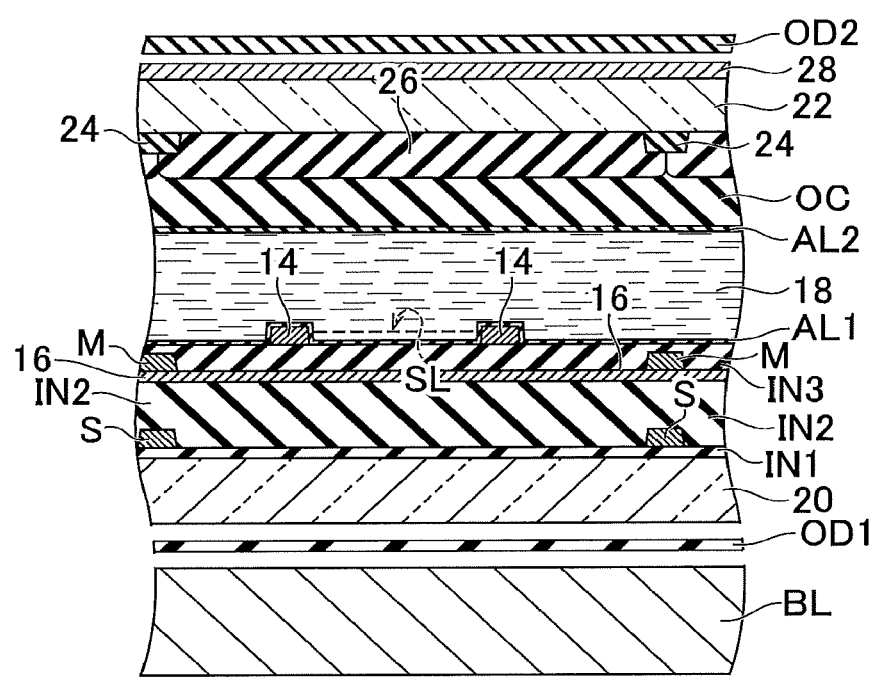
FIG. 4 is IV-IV line cross sectional view of the display device in FIG. 1.

FIG. 4 is IV-IV line cross sectional view of the display device in FIG. 1. The liquid crystal layer 18 lies between the first substrate 20 and the second substrate 22. The display panel 10 of the embodiment is configured in response to an in-plane switching (IPS) mode using a lateral electric field almost parallel to a major surface. The IPS display mode using the lateral electric field is available for a structure where the pixel electrodes 14 and the common electrodes 16 are both provided on one side of the first substrate 20. The embodiment particularly employs a fringe field switching (FFS) mode; thus, the pixel electrodes 14 are independently disposed in respective subpixels SP although the common electrodes 16 spread over the plurality of subpixels SP to be flat.

On the first substrate 20 may be provided the signal line S, the common electrode 16, a metal layer M, the pixel electrode 14, a first insulation film IN1, a second insulation film IN2, a third insulation film IN3, and a first alignment film AL1. The switching element SW and the scan line G with insulation films therebetween are herein unillustrated. The first insulation film IN1 is on the first substrate 20. The scan line G and a semiconductor layer of the switching element SW, which are unillustrated, lie between the first substrate 20 and the first insulation film IN1. The signal line S is on the first insulation film IN1. The second insulation film IN2 is on the signal line S and the first insulation film IN1. The common electrode 16 is on the second insulation film IN2. The metal layer M, which is for lowering resistance of and for inputting signals to the common electrode 16, is in contact with the common electrode 16 just above the signal line S. The metal layer M is illustrated to be on the common electrode 16 or may be between the common electrode 16 and the second insulation film IN2. The third insulation film IN3 is on the common electrode 16 and the metal layer M. The pixel electrode 14 is on the third insulation film IN3. The pixel electrodes 14 are opposed to the common electrode 16 with the third insulation film IN3 therebetween. The pixel electrode 14 has a slit SL at a position opposed to the common electrode 16. The first alignment film AL1 covers the pixel electrode 14 and the third insulation film IN3.

The scan line G, the signal line S, and the metal layer M are made from metal material such as molybdenum, tungsten, titanium, and aluminum, having a single-layer structure or a multi-layer structure. The common electrode 16 and the pixel electrode 14 are made from transparent conductive material such as indium tin oxide (ITO) or indium zinc oxide (IZO). The first insulation film IN1 and the third insulation film IN3 are inorganic insulation films. The second insulation film IN2 is an organic insulation film.

On the second substrate 22 may be provided a black matrix layer 24, a color filter layer 26, an overcoat layer OC, and a second alignment film AL2. The black matrix layer 24 and the color filter layer 26 are positioned on the second substrate 22 on a side opposed to the first substrate 20. The black matrix layer 24 partitions the subpixels SP and is just on the signal lines S, the scan lines G and the switching elements SW. The color filter layer 26 is opposed to the pixel electrodes 14 and partially overlap with the black matrix layer 24. The overcoat layer OC covers the color filter layer 26. The second alignment film AL2 covers the overcoat layer OC.

The second substrate 22, on its surface opposite to the liquid crystal layer 18, has detection electrodes 28 formed thereon, to be used for reception electrodes Rx for touch sensing. The detection electrodes 28 are on a major surface of the second substrate 22. The detection electrodes 28 may be made from transparent conductive material such as metal, indium tin oxide (ITO), or indium zinc oxide (IZO) or may be made from opaque metal material such as aluminum (Al) for lower resistance. Opaque metal materials are used for the detection electrodes 28 in the embodiment.

A first optical element OD1 including a first polarizing plate lies between the first substrate 20 and a lighting equipment BL. A second optical element OD2 including a second polarizing plate is on the detection electrode 28. The first optical element OD1 or the second optical element OD2 may include a retardation plate, if necessary.

Figure 5:
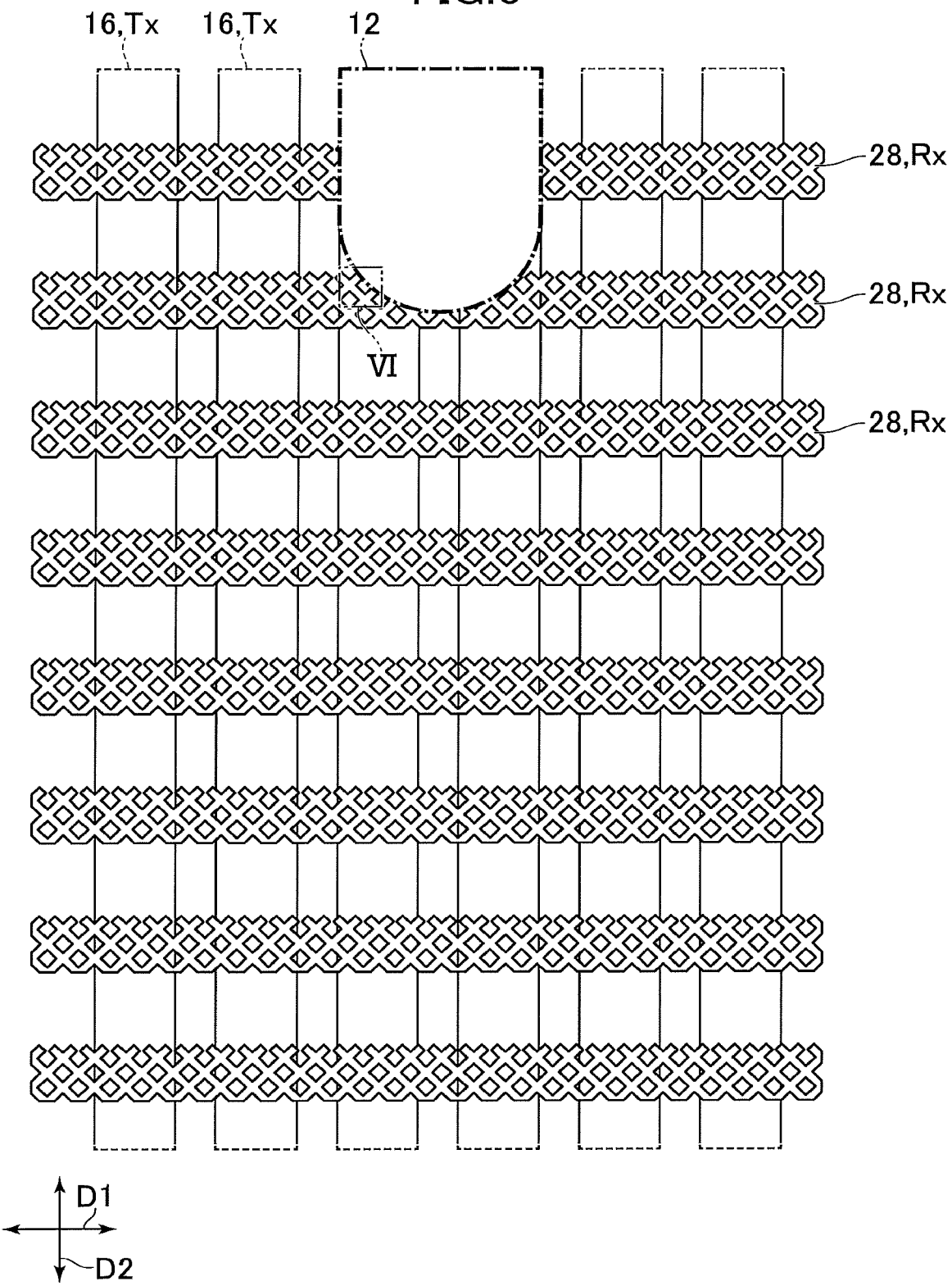
FIG. 5 is a diagram to explain a structure for touch sensing.

FIG. 5 is a diagram to explain a structure for touch sensing. The embodiment employs a mutual capacitance type in which an object is detectable based on change of capacitance between a pair of electrodes. The electrodes used for touch sensing are, as shown in FIG. 5, the common electrodes 16 and the detection electrodes 28. The common electrodes 16 are a common electrode for screen display as mentioned above but are used for transmission electrodes Tx for touch sensing as well, whereas the detection electrodes 28 are used for reception electrodes Rx. Each detection electrode 28 has a plurality of openings to be in a mesh shape. Some sets of detection electrodes 28 extend in the first direction D1 and are arranged in the second direction D2, on the display panel 10. The detection electrodes 28 are electrically opposite to the common electrodes 16. The common electrodes 16 each have a strip shape extending in the second direction D2, leaving a space from each other in the first direction D1. Each common electrode 16 is electrically connected to the common electrode drive circuit CD in FIG. 2. The common electrode drive circuit CD supplies a common drive signal to the common electrodes 16 during display drive period for displaying images in the display area DA.

The common drive circuit CD supplies a sensor drive signal to the common electrodes 16 during sensing drive period for touch sensing. Following supply of the sensor drive signal to the common electrodes 16, the detection electrode 28 outputs a sensor signal necessary for sensing, namely, a signal based on capacitance change between the common electrodes (transmission electrodes Tx) 16 and the detection electrode 28.

As described above, the common electrodes 16 serve to generate an electrical field with the pixel electrodes 14 and also serve to detect the position of the object by forming a capacity with the detection electrode 28. The display panel 10 of the embodiment has a cutout 12 in FIG. 5. Some of the detection electrodes 28 at the cutout 12 have a break or a narrow part formed with the cutout 12 in the middle. The broken detection electrode 28 formed with the cutout 12 is electrically connected by providing a contour line 29 running around the cutout 12 (described later).

Figure 6:
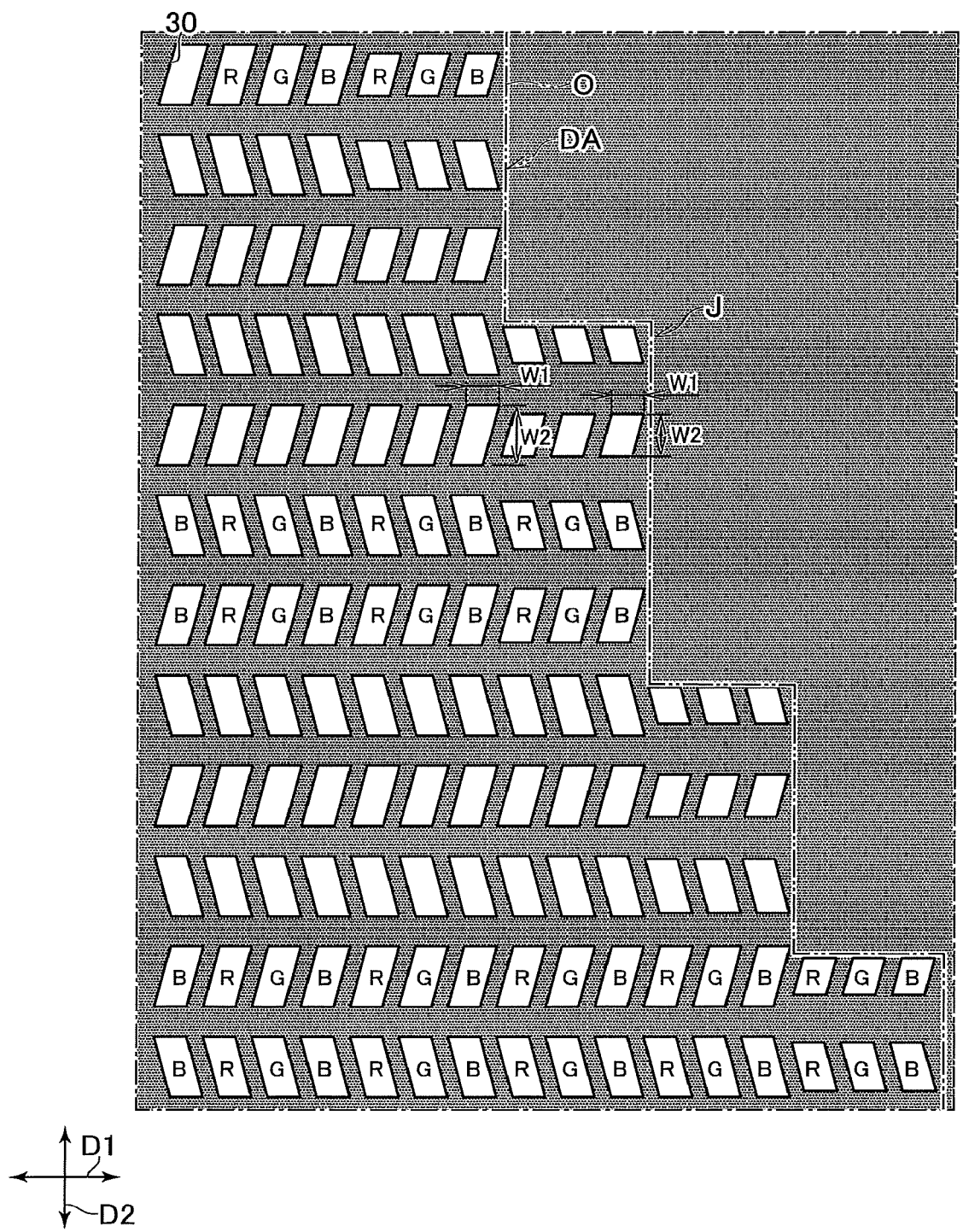
FIG. 6 is an enlarged view of a portion pointed to by VI of the display device in FIG. 1.

FIG. 6 is an enlarged view of an area VI of the display device 10 in FIG. 1. The display area DA is an area where the black matrix layer 24 has a plurality of openings 30. The outline O is outside the plurality of openings 30 at their outermost side. The openings 30 relate to the respective pixel electrodes 14 (FIG. 3). Each opening 30 has a first width W1 in the first direction D1 and a second width W2 in the second direction D2.

The openings 30 relate to the respective subpixels SP (FIG. 2) in some colors. Specifically, color filters in three colors of red R, green G, and blue B, for units constituting one pixel, are arranged in this order in the first direction D1. Color filters in one color are arranged in a column along the second direction D2.

The display area DA in FIG. 6 at a curve part of its contour has the outline O arranged stepwise due to the cutout 12, forming a jaggy portion J.

Additionally, some of the openings 30 in the black matrix at the jaggy portion J of the embodiment have different sizes at different positions, as shown in FIG. 6, for displaying a smoother curve.

Specifically, the second width W2 at the staircase pattern portion is smaller than at other portions. The second width W2 at the jaggy portion J has a different size; an appropriate size is selected in accordance with curvature of the curve.

This makes the jaggy portion J less noticeable, allowing a viewer of the display panel to perceive the outline O as a smoother curve.

Figure 7:
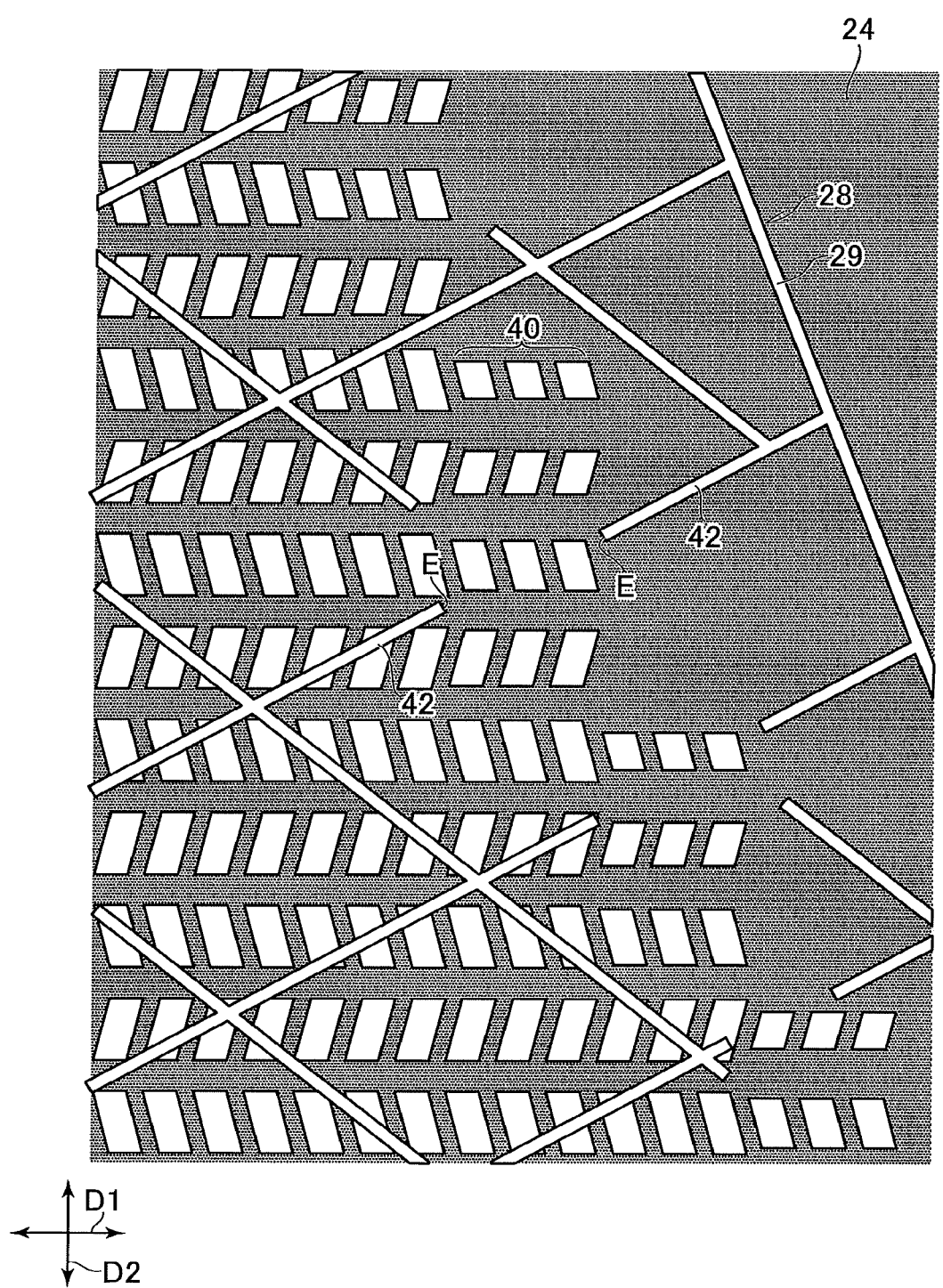
FIG. 7 is a detail view of touch electrodes.

FIG. 7 is a detail view of the detection electrode at the jaggy portion J. The detection electrode 28 has a mesh shape so as to have some metal lines 42 extending in two directions in FIG. 5 and intersecting at some positions. The detection electrode 28 consists of combination of many metal lines 42 each made from opaque metal. The subpixel SP has a different size depending on the display panel, whereas each metal line of the detection electrode 28 is ordinarily smaller in width than the opening 30 (W1, W2) of the black matrix, and an opening space of the mesh is considerably larger than each subpixel SP.

This minimizes effect on the display, since the metal lines 42 in the entire display area DA shield a smaller proportion of the openings 30, although the metal lines 42 of the detection electrode 28 in the display area DA overlap partially with the openings 30 of the black matrix.

FIG. 6, however, shows that some openings 30 of the black matrix, at the curve part of the contour such as the jaggy portion J, are smaller than normal openings in size. Overlaying such an area with the metal lines 42 of the detection electrode 28 may widen areas where the openings 30 of the black matrix are covered with the metal lines 42, making an aperture ratio tremendously low to result in unnatural display.

To avoid such a problem, the embodiment employs a wiring non-forming portion E, where no metal lines 42 are formed, over the openings 30 of the black matrix at the jaggy portion J.

By employing such a structure, the small-sized opening 30 of the black matrix, to form the smoothly curved outline O of the display area DA, is not covered with the detection electrodes 28 of opaque metal lines, keeping display quality of the curved outline O.

FIG. 7 shows that the detection electrode 28 has a contour line 29 connected to the metal lines 42 and extending along the shape of the cutout 12. As mentioned above, the metal lines 42 are not formed over the small-sized openings 30, forming a wiring non-forming portion E. Not all portions near the cutout 12 are the wiring non-forming portion E. Some of the metal lines 42 extend to the contour line 29. As is not illustrated, the contour line 29 serves to electrically connects portions of the detection electrode 28 divided into right and left, bypassing the cutout 12 in the display panel with the cutout 12 in the middle thereof as shown in FIG. 5. With the wiring non-forming portion E partially provided, the detection electrodes 28 still have the function for the reception electrodes Rx.

The embodiment shows an example where the wiring non-forming portion E is formed at the jaggy portion J near the cutout 12. The wiring non-forming portion E, where no detection electrode 28 is formed, may be provided in not only such a portion in the embodiment but also a rounded corner of the display panel 10.

The embodiment exemplarily shows that the wiring non-forming portion E is formed over a pixel area where the openings 30 of the black matrix are small. Another example of the display panel, where all openings 30 of the black matrix are equivalent in the display area DA, may employ the wiring non-forming portion E with no detection electrode 28, at a portion where subpixels SP are arranged stepwise just like the jaggy portion J. This also can improve display quality of a curve part in the display area DA.

The embodiment illustrates a liquid crystal display device, but the preset invention is not limited thereto and may be applied to an organic EL display device. While there have been described what are at present considered to be certain embodiments, it will be understood that various modifications may be made thereto, and it is intended that the appended claims cover all such modifications as fall within the true spirit and scope of the invention.

What is claimed is:

1. A display device comprising:
    a display panel having a display area where a plurality of subpixels for emitting light in different colors are arranged in a matrix shape, the display panel having a peripheral area where terminals and a drive circuit are foamed; and
    metal lines for touch sensing on the display panel, wherein
    the display panel has a non-rectangular shape with a curve part of a contour in a plan view,
    the metal lines extend in at least two directions and cross at a plurality of portions to form a mesh shape, the plurality of subpixels include some subpixels arranged stepwise in an outline area of the display area next to the curve part of the contour, the metal lines include a contour line along a shape of the curve part, in the outline area of the display area next to the curve part, the metal lines include a pair of edges opposed to each other in the outline area, and the subpixels arranged stepwise are disposed between the pair of edges.

2. The display device according to claim 1, wherein the plurality of subpixels have areas in different sizes for emitting the light in the display area, and the subpixels arranged stepwise are smaller than others of the plurality of subpixels in other places in the display area, with respect to the areas for emitting the light.

3. The display device according to claim 2, wherein the metal lines overlap with the plurality of subpixels except for the subpixels next to the curve part.

4. The display device according to claim 2, wherein the contour line is connected to another line of the metal lines in the mesh shape.

5. The display device according to claim 2, wherein the display panel has a first substrate, a second substrate, and a liquid crystal layer between the first substrate and the second substrate, the first substrate has pixel electrodes for the respective plurality of subpixels and common electrodes over the plurality of subpixels, the second substrate has color filters for the respective plurality of subpixels and a shading layer for partitioning the plurality of subpixels, and the areas of the plurality of subpixels for emitting the light vary in accordance with respective sizes of openings of the shading layer.

6. The display device according to claim 5, wherein the first substrate has scanning signal lines extending in a first direction and arranged in a second direction perpendicular to the first direction, the first substrate has video signal lines extending in the second direction and arranged in the first direction, the openings of the shading layer have respective sides along the scanning signal lines and other respective sides along the video signal lines, the sides along the video signal lines have respective sizes in the display area, the sides along the video signal lines include a first side of an opening for each of the subpixels arranged stepwise, the sides along the video signal lines include a second side of another opening for each of the plurality of subpixels except for the subpixels arranged stepwise, and the first side is smaller than the second side.

7. The display device according to claim 5, wherein the second substrate has the metal lines on a surface opposite to another surface where the shading layer is formed.

8. The display device according to claim 5, wherein the metal lines are reception electrodes for the touch sensing, and the common electrodes serve as transmission electrodes for the touch sensing.

9. The display device according to claim 1, wherein the display panel is an organic EL display device.

* * * * *